United States Patent
Fujita et al.

(10) Patent No.: US 11,125,616 B2
(45) Date of Patent: Sep. 21, 2021

(54) PHOTODETECTOR DEVICE COMPRISING EACH OF A PLURALITY OF PASSIVE QUENCHING ELEMENTS CONNECTED IN SERIES TO AT LEAST ONE AVALANCHE PHOTODIODE AND A CAPACITATIVE ELEMENT CONNECTED IN PARALLEL TO THE PASSIVE QUENCHING ELEMENT

(71) Applicant: HAMAMATSU PHOTONICS K.K., Hamamatsu (JP)

(72) Inventors: Takuya Fujita, Hamamatsu (JP); Yusei Tamura, Hamamatsu (JP); Kenji Makino, Hamamatsu (JP); Takashi Baba, Hamamatsu (JP); Koei Yamamoto, Hamamatsu (JP)

(73) Assignee: HAMAMATSU PHOTONICS K.K., Hamamatsu (JP)

( * ) Notice: Subject to any disclaimer, the term of this patent is extended or adjusted under 35 U.S.C. 154(b) by 0 days.

(21) Appl. No.: 16/963,312

(22) PCT Filed: Jan. 24, 2019

(86) PCT No.: PCT/JP2019/002352
§ 371 (c)(1),
(2) Date: Jul. 20, 2020

(87) PCT Pub. No.: WO2019/146725
PCT Pub. Date: Aug. 1, 2019

(65) Prior Publication Data
US 2020/0370954 A1 Nov. 26, 2020

(30) Foreign Application Priority Data
Jan. 26, 2018 (JP) .............................. JP2018-011824

(51) Int. Cl.
*H01L 31/02* (2006.01)
*G01J 1/44* (2006.01)
(Continued)

(52) U.S. Cl.
CPC ............ *G01J 1/44* (2013.01); *H01L 27/1446* (2013.01); *H01L 31/02027* (2013.01);
(Continued)

(58) Field of Classification Search
CPC ................ G01J 1/44; G01J 2001/4466; H01L 31/02027; H01L 31/107; H04N 5/378
(Continued)

(56) References Cited

U.S. PATENT DOCUMENTS 10,012,534 B2 * 7/2018 Andreou ............... H01L 31/107
2013/0270666 A1 10/2013 Sato et al.
2015/0115131 A1 4/2015 Webster et al.

FOREIGN PATENT DOCUMENTS

JP 2012-531753 A 12/2012
JP 2013-089919 A 5/2013
(Continued)

OTHER PUBLICATIONS

International Preliminary Report on Patentability dated Aug. 6, 2020 for PCT/JP2019/002352.

*Primary Examiner* — Que Tan Le
(74) *Attorney, Agent, or Firm* — Faegre Drinker Biddle & Reath LLP

(57) ABSTRACT

A photodetector device includes an avalanche photodiode array substrate formed from compound semiconductor. A plurality of avalanche photodiodes arranged to operate in a Geiger mode are two-dimensionally arranged on the avalanche photodiode array substrate. A circuit substrate includes a plurality of output units which are connected to each other in parallel to form at least one channel. Each of
(Continued)

the output units includes a passive quenching element and a capacitative element. The passive quenching element is connected in series to at least one of the plurality of avalanche photodiodes. The capacitative element is connected in series to at least one of the avalanche photodiodes and is connected in parallel to the passive quenching element.

2 Claims, 11 Drawing Sheets

(51) Int. Cl.
*H01L 27/144* (2006.01)
*H01L 31/107* (2006.01)

(52) U.S. Cl.
CPC ...... *H01L 31/107* (2013.01); *G01J 2001/442* (2013.01); *G01J 2001/4466* (2013.01)

(58) Field of Classification Search
USPC .......................................... 250/214 R, 214.1
See application file for complete search history.

(56) References Cited

FOREIGN PATENT DOCUMENTS

| JP | 2016-519435 A | 6/2016 |
|----|---------------|--------|
| JP | 2016-122716 A | 7/2016 |
| JP | 2018-173379 A | 11/2018 |
| WO | WO-2010/151888 A1 | 12/2010 |
| WO | WO-2014/172697 A1 | 10/2014 |

* cited by examiner

PHOTODETECTOR DEVICE COMPRISING EACH OF A PLURALITY OF PASSIVE QUENCHING ELEMENTS CONNECTED IN SERIES TO AT LEAST ONE AVALANCHE PHOTODIODE AND A CAPACITATIVE ELEMENT CONNECTED IN PARALLEL TO THE PASSIVE QUENCHING ELEMENT

TECHNICAL FIELD

The present invention relates to a photodetector device.

BACKGROUND ART

A photodetector device in which a plurality of avalanche photodiodes are two-dimensionally arranged is known (for example, Patent Literature 1). The plurality of avalanche photodiodes is arranged to operate in a Geiger mode. The plurality of avalanche photodiodes are formed on a semiconductor substrate formed from compound semiconductor.

CITATION LIST

Patent Literature

Patent Literature 1: Japanese Unexamined Patent Publication No. 2012-531753

SUMMARY OF INVENTION

Technical Problem

In a case where a plurality of avalanche photodiodes formed on the semiconductor substrate formed from the compound semiconductor is arranged to operate in the Geiger mode, a dark pulse and an after pulse increase in correspondence with a temperature variation. When a noise increases due to the dark pulse and the after pulse, there is a concern that a signal from the avalanche photodiodes may not be appropriately detected.

There is known a configuration in which passive quenching elements are arranged in series to the avalanche photodiodes to quench avalanche multiplication in a case where the avalanche photodiodes is arranged to operate in the Geiger mode. Whether or not an avalanche multiplication process that occurs inside the avalanche photodiodes connected to the passive quenching element is appropriately quenched is determined depending on a resistance value of the passive quenching element. When the resistance value of the quenching elements is not sufficient, there is a concern that appropriate quenching is not realized due to occurrence of a latching current or the like. It is necessary to select a sufficient resistance value of the quenching elements for appropriate quenching.

As the resistance value of the passive quenching elements is larger, time necessary for quenching of the avalanche photodiodes which are connected to the passive quenching elements in series increases. As the time necessary for the quenching increases, dead time for which light cannot be detected by the avalanche photodiodes increases. As described above, there is a demand for a circuit design including passive quenching elements having an optimal resistance value to make appropriate quenching and reduction of the dead time compatible with each other and to secure photodetection sensitivity and photodetection time resolution.

Since a parasitic capacitance in the passive quenching elements also has an influence on a pulse signal, and thus removal of the parasitic capacitance is also demanded. It is also demanded to improve a peak value of the pulse signal to further improve the photodetection time resolution. It is very difficult to design a device in which the plurality of avalanche photodiodes formed on the semiconductor substrate formed from the compound semiconductor are arranged to operate in the Geiger mode so as to satisfy all of the above-described desired conditions.

An object of an aspect of the invention is to provide a photodetector device in which photodetection sensitivity and an improvement of photodetection time resolution are compatible in a configuration in which a plurality of avalanche photodiodes are formed on a semiconductor substrate formed from compound semiconductor.

Solution to Problem

According to an aspect of the invention, there is provided a photodetector device including an avalanche photodiode array substrate and a circuit substrate. The avalanche photodiode array substrate is formed from compound semiconductor. The avalanche photodiode array substrate is mounted on the circuit substrate. A plurality of avalanche photodiodes are two-dimensionally arranged in the avalanche photodiode array substrate. The plurality of avalanche photodiode is arranged to operate in a Geiger mode. The circuit substrate includes a plurality of output units connected to each other in parallel. The plurality of output units form at least one channel. Each of the output units includes a passive quenching element and a capacitative element. The passive quenching element is connected in series to at least one of the plurality of avalanche photodiodes. The capacitative element is connected in series to at least one of the avalanche photodiodes, and is connected in parallel to the passive quenching element.

In this aspect, the plurality of output units including the passive quenching element and the capacitative element are provided in the circuit substrate different from the avalanche photodiode array substrate. According to this, a space capable of forming the plurality of output units can be further expanded in comparison to a case where the plurality of output units are arranged in the avalanche photodiode array substrate. When the output units are provided in the circuit substrate separate from the avalanche photodiode array substrate, a parasitic capacitance that occurs between a configuration of the avalanche photodiodes and the output units can be reduced. In this case, a manufacturing process different from that of the avalanche diode array substrate can also be used. Accordingly, the design of the plurality of output units becomes easy. The capacitative element provided in the photodetector device is connected in series to at least one of the avalanche photodiodes and is connected in parallel to the passive quenching element. According to this, a peak value of a pulse signal transmitted from the avalanche photodiode that is connected in series to the capacitative element can be improved due to the electrostatic capacitance of the capacitative element. Accordingly, a pulse signal transmitted from the plurality of avalanche photodiodes is easily detected, and light detection resolution can be further improved.

In the aspect, the passive quenching element may be formed by a first polysilicon layer provided in the circuit substrate. The capacitative element may be formed by a second polysilicon layer provided in the circuit substrate, a dielectric layer stacked on the second polysilicon layer, and a third polysilicon layer stacked on the dielectric layer. The first polysilicon layer may be formed at the same height as in the second polysilicon layer or the third polysilicon layer in a thickness direction of the circuit substrate. In this case, the plurality of output units can be formed by a simple manufacturing process.

Advantageous Effects of Invention

According to the aspect of the invention, there is provided a photodetector device capable of securing photodetection accuracy with a simple design in a configuration in which a plurality of avalanche photodiodes are formed on a semiconductor substrate formed from compound semiconductor.

DESCRIPTION OF EMBODIMENTS

Figure 1:
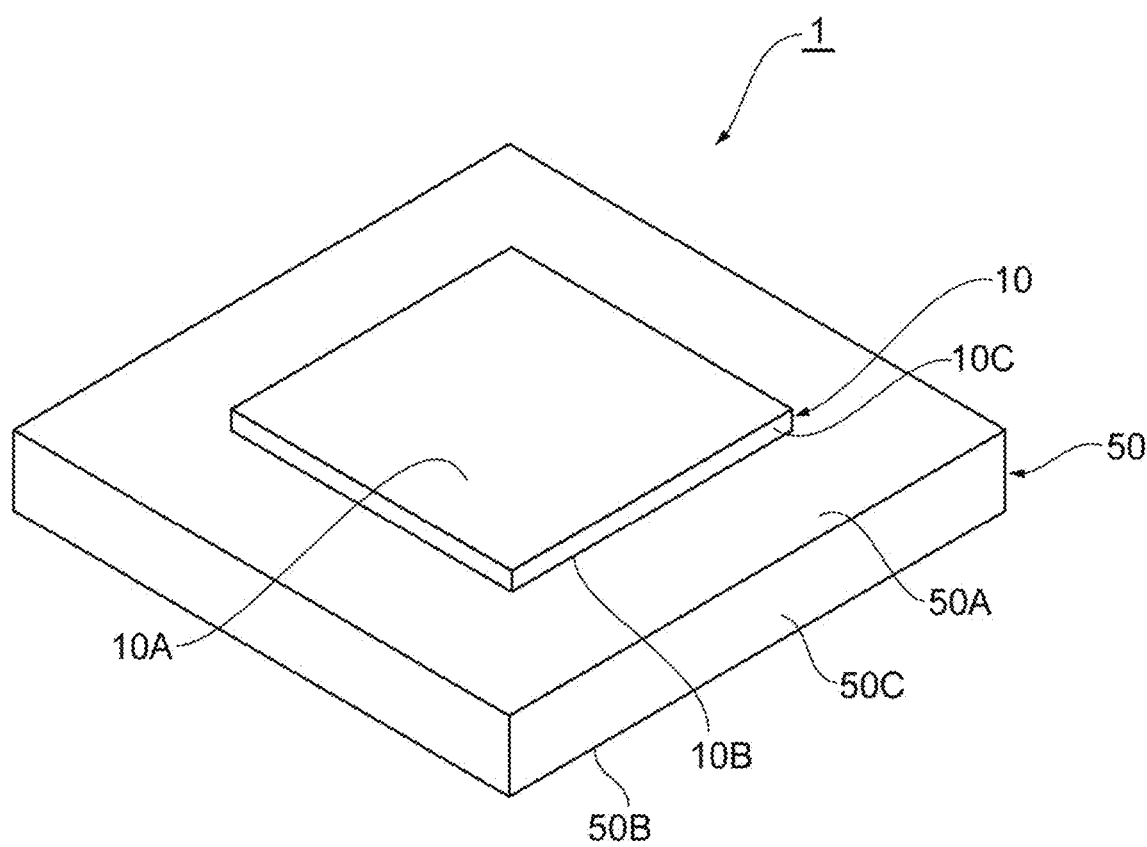
FIG. 1 is a perspective view of a photodetector device according to an embodiment.

Hereinafter, an embodiment of the invention will be described in detail with reference to the accompanying drawings. Note that, in description, the same reference numeral will be given to the same elements or elements having the same function, and redundant description thereof will be omitted.

Figure 2:
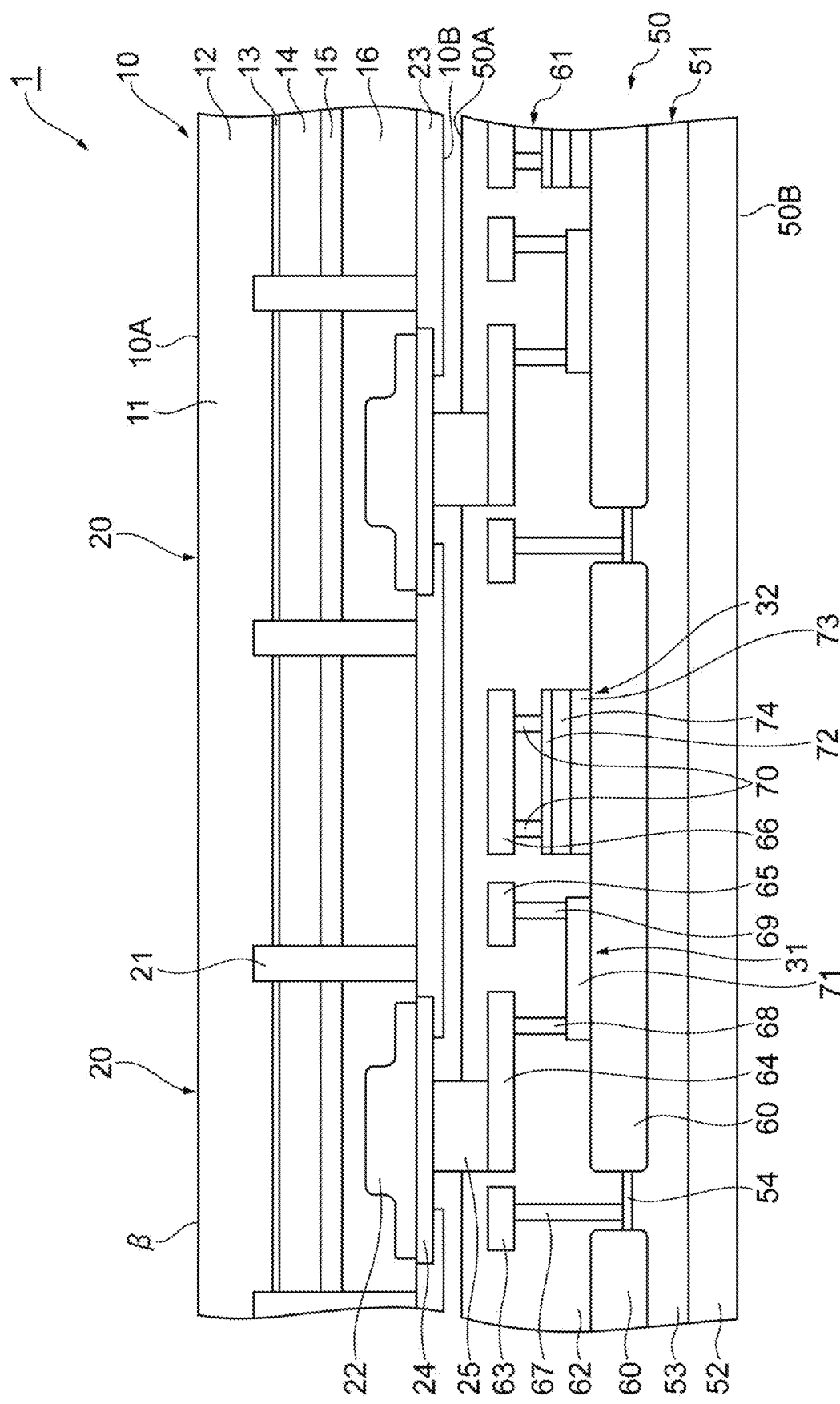
FIG. 2 is a view illustrating a cross-sectional configuration of the photodetector device.
Figure 3:
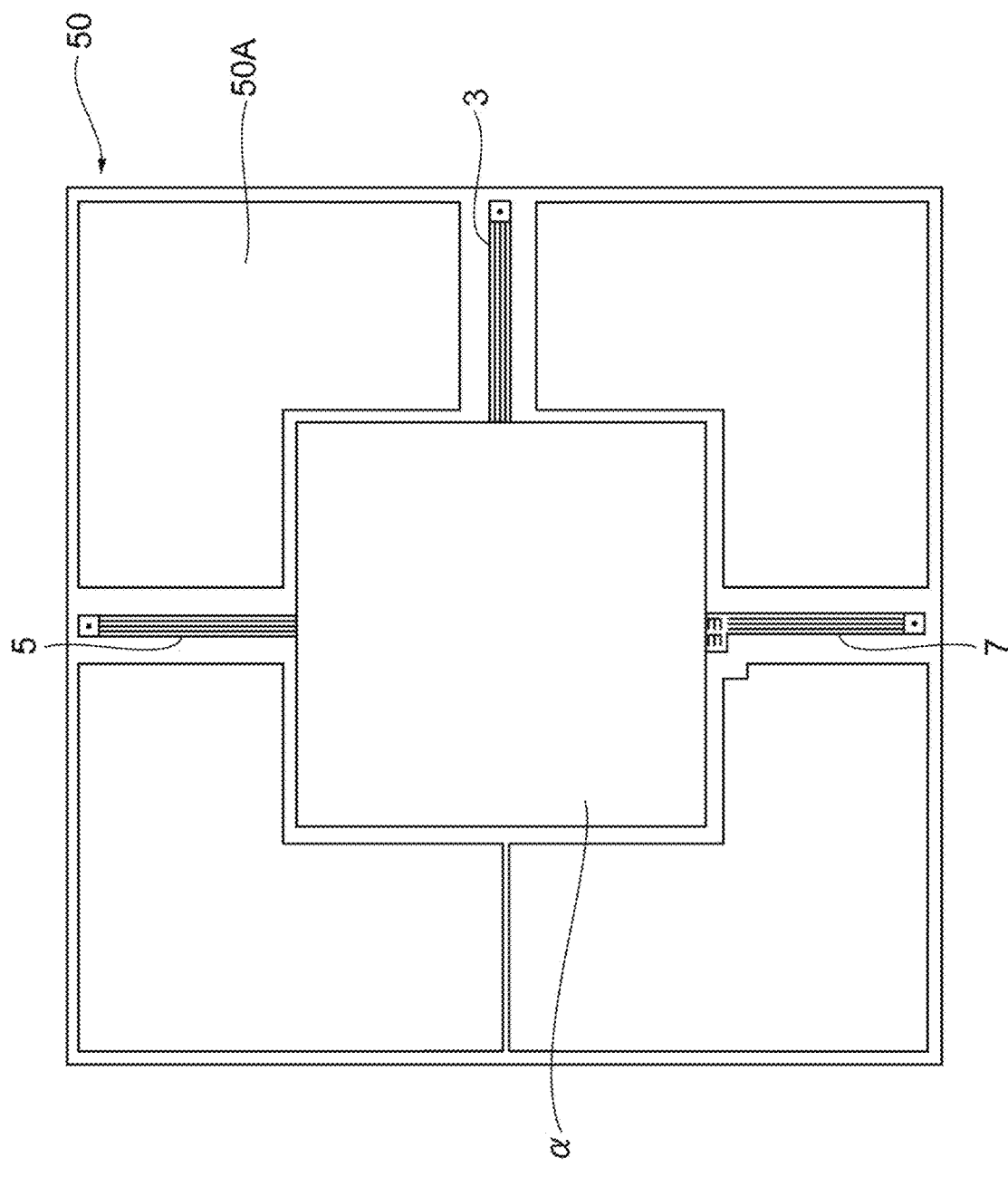
FIG. 3 is a plan view of a circuit substrate.
Figure 4:
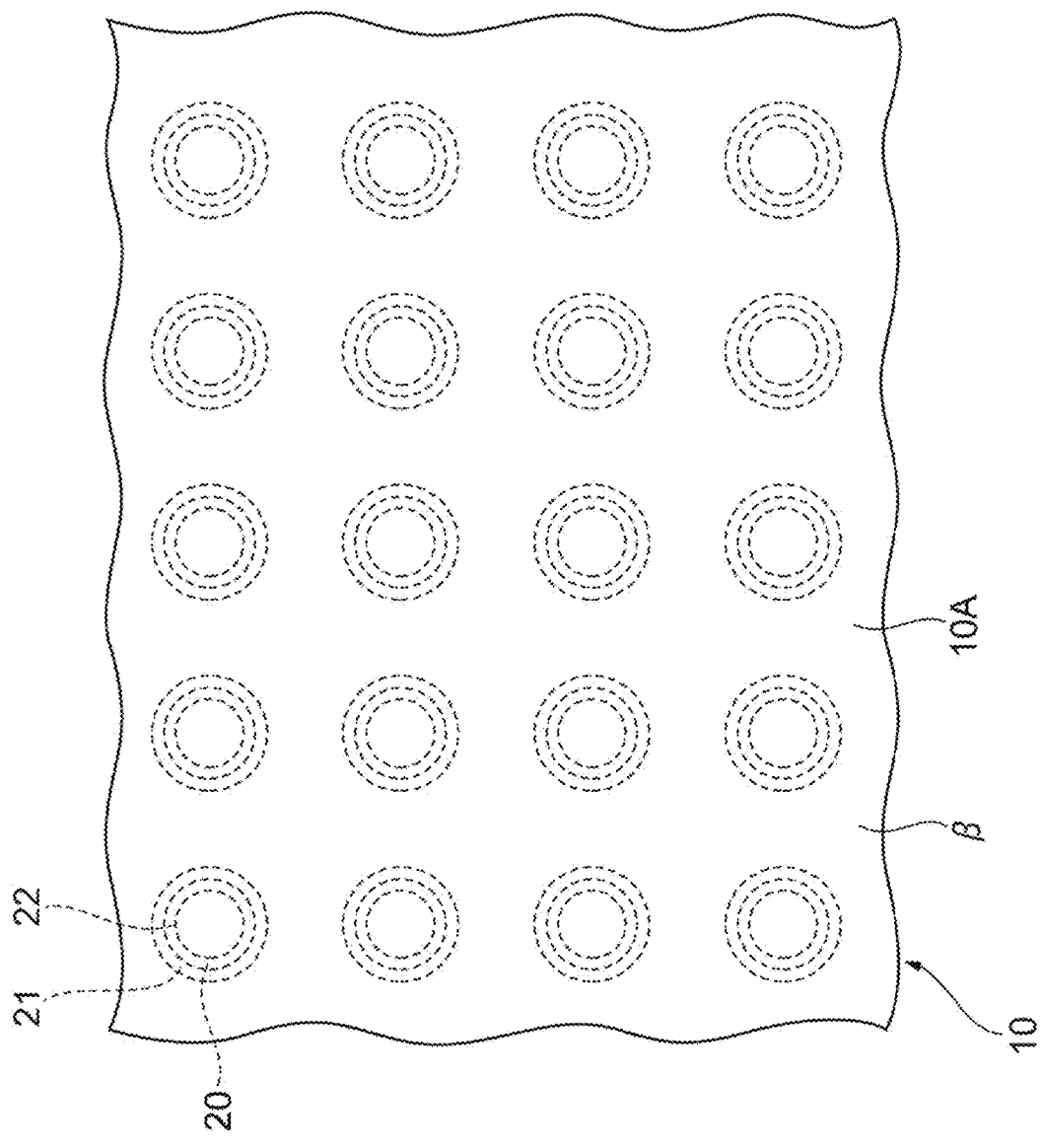
FIG. 4 is a plan view of a photodetection region of an avalanche photodiode array substrate.

First, a whole configuration of a photodetector device according to this embodiment will be described with reference to FIG. 1 to FIG. 8. FIG. 1 is a perspective view of the photodetector device according to this embodiment. FIG. 2 is a view illustrating a cross-sectional configuration of the photodetector device according to this embodiment. In FIG. 2, hatching is omitted to improve visibility. FIG. 3 a plan view of a circuit substrate. FIG. 4 is a plan view illustrating a part of an avalanche photodiode array substrate. FIG. 6 is a view illustrating a circuit configuration capable of being used in the photodetector device according to this embodiment. FIG. 8 is a plan view illustrating a part of the circuit substrate.

As illustrated in FIG. 1, a photodetector device 1 includes an avalanche photodiode array substrate 10 and a circuit substrate 50. Hereinafter, "avalanche photodiode" is referred to as "APD". "Avalanche photodiode array substrate" is referred to as "APD array substrate". The circuit substrate 50 is disposed to face the APD array substrate 10. The APD array substrate 10 and the circuit substrate 50 have a rectangular shape in plan view.

The APD array substrate 10 includes a main surface 10A and a main surface 10B which are opposite to each other, and a side surface 10C. The circuit substrate 50 includes a main surface 50A and a main surface 50B which are opposite to each other, and a side surface 50C. The main surface 10B of the APD array substrate 10 faces the main surface 50A of the circuit substrate 50. A plan parallel to the respective main surfaces of the APD array substrate 10 and the circuit substrate 50 is an XY-axis plan, and a direction orthogonal to the respective main surface is a Z-axis direction.

The side surface 50C of the circuit substrate 50 is located on an outer side in the XY-axis plane direction in comparison to the side surface 10C of the APD array substrate 10. That is, in plan view, an area of the circuit substrate 50 is greater than an area of the APD array substrate 10. The side surface 10C of the APD array substrate 10 and the side surface 50C of the circuit substrate 50 may be flush with each other. In this case, in plan view, an outer edge of the APD array substrate 10 and an outer edge of the circuit substrate 50 match each other.

A glass substrate may be disposed on the main surface 10A of the APD array substrate 10. The glass substrate and the APD array substrate 10 are optically connected to each other by an optical adhesive. The glass substrate may be directly formed on the APD array substrate 10. The side surface 10C of the APD array substrate 10 and a side surface of the glass substrate may be flush with each other. In this case, in plan view, the outer edge of the APD array substrate 10 and the outer edge of the glass substrate match each other. In addition, the side surface 10C of the APD array substrate 10, the side surface 50C of the circuit substrate 50, and the side surface of the glass substrate may be flush with each other. In this case, in plan view, the outer edge of the APD array substrate 10, the outer edge of the circuit substrate 50, and the outer edge of the glass substrate match each other.

The APD array substrate 10 is mounted on the circuit substrate 50. As illustrated in FIG. 2, the APD array substrate 10 and the circuit substrate 50 are connected to each other by the bump electrode 25. Specifically, as illustrated in FIG. 3, the APD array substrate 10 is connected to the bump electrode 25 over a mounting region α disposed at the center of the circuit substrate 50 when viewed from a thickness direction of the APD array substrate 10. In this embodiment, the mounting region α has a rectangular shape.

The circuit substrate 50 includes a ground line 3, a cathode line 5, and an anode line 7 at the periphery of the mounting region α. The ground line 3, the cathode line 5, and the anode line 7 extend from the mounting region α. The ground line 3 is connected to a ground electrode 63 to be described later. The cathode line 5 is electrically connected to the APD array substrate 10 mounted in the mounting region α, and can be used for application of a voltage to the APD array substrate 10. The anode line 7 is connected to metal layers 65 and 66 to be described later, and is used in read-out of a signal transmitted from the APD array substrate 10.

The APD array substrate 10 includes a plurality of APDs 20 which is arranged to operate in a Geiger mode. As illustrated in FIG. 4, the plurality of APDs 20 are two-dimensionally arranged in a photodetection region β of the semiconductor substrate 11 when viewed from the thickness direction of the APD array substrate 10. The photodetection region β has a rectangular shape, and overlaps the mounting region α of the circuit substrate 50 when viewed from the thickness direction of the APD array substrate 10.

The APD array substrate 10 includes an N-type semiconductor substrate 11 formed from compound semiconductor. The semiconductor substrate 11 includes a substrate 12 formed from InP that forms the main surface 10A. A buffer layer 13 formed from InP, an absorption layer 14 formed from InGaAsP, an electric field relaxing layer 15 formed from InGaAsP, a multiplication layer 16 formed from InP are formed on the substrate 12 in this order from the main surface 10A side to the main surface 10B side. The absorption layer 14 may be formed from InGaAs. The semiconductor substrate 11 may be formed from GaAs, InGaAs, AlGaAs, InAlGaAs, CdTe, HgCdTe, or the like.

As illustrated in FIG. 2 and FIG. 4, each of the APDs 20 is surrounded by an insulating portion 21 when viewed from the thickness direction of the APD array substrate 10. The APD 20 includes a P-type active area 22 that is formed by doping the multiplication layer 16 with impurities from the main surface 10B side. Examples of the doping impurities include zinc (Zn). For example, the insulating portion 21 is provided by forming a polyimide film in a trench formed through wet etching or dry etching. The active area 22 formed in a circular shape when viewed from the thickness direction, and the insulating portion 21 is formed in an annular shape along an edge of the active area 22. The insulating portion 21 reaches the substrate 12 from the main surface 10B side of the semiconductor substrate 11 in the thickness direction of the APD array substrate 10

Figure 5:
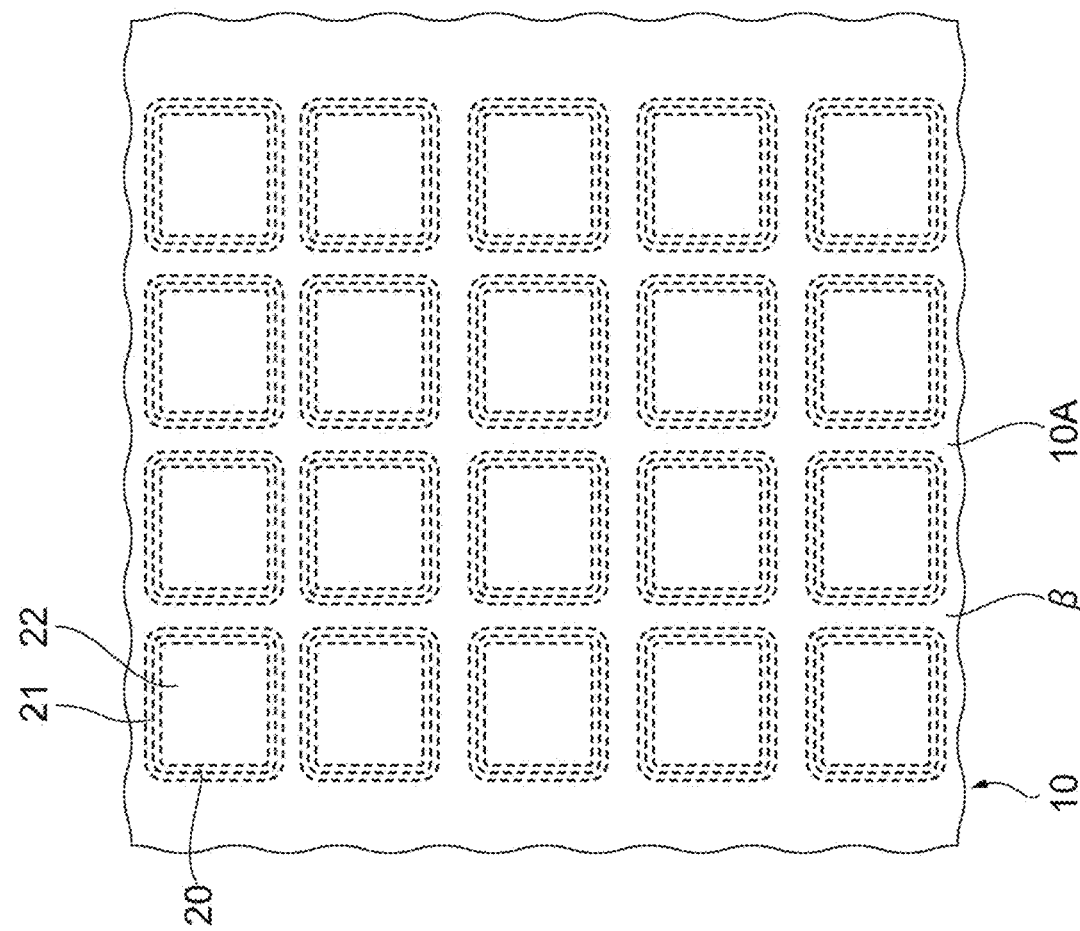
FIG. 5 is a view illustrating a configuration of a circuit substrate.
Figure 6:
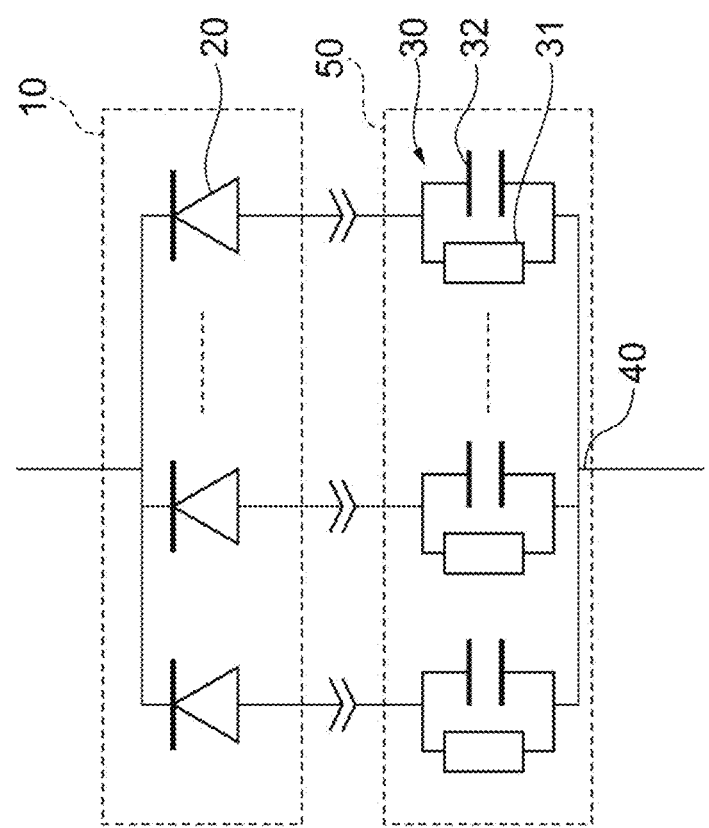
FIG. 6 is a view illustrating a circuit configuration capable of being used in the photodetector device.

FIG. 5 is a view illustrating a part of an avalanche photodiode array substrate capable of being used in photodetector device according to a modification example of this embodiment. As illustrated in FIG. 5, the active area 22 may be formed in an approximately rectangular shape when viewed from the thickness direction. Here, the approximately rectangular shape is a rectangular shape with rounded corners. According to this, concentration of an electric field to the corners of the active area 22 is suppressed. In this case, the insulating portion 21 is formed in an annular shape along an edge of the active area 22 having an approximately rectangular shape.

The APD array substrate 10 includes an insulating layer 23 and a plurality of electrode pads 24. The insulating layer 23 covers the semiconductor substrate 11 on the main surface 10B side. Each of the electrode pads 24 is formed on the semiconductor substrate 11 on the main surface 10B side for every APD 20, and is in contact with the active area 22. The electrode pad 24 is exposed from the insulating layer 23, and is connected to the circuit substrate 50 through the bump electrode 25.

As illustrated in FIG. 2, the circuit substrate 50 is connected to the APD array substrate 10 on the main surface 50A side through the bump electrode 25. The circuit substrate 50 includes a plurality of output unit 30. As illustrated in FIG. 6, the plurality of output units 30 are connected to each other in parallel, and forms one channel 40. Each of the plurality of output units 30 is connected in series to each of the APDs 20 provided in the APD array substrate 10. The output unit 30 includes a passive quenching element 31 and a capacitative element 32 which are connected to each other in parallel. Any of the passive quenching element 31 and the capacitative element 32 is connected in series to the APD 20.

Figure 7:
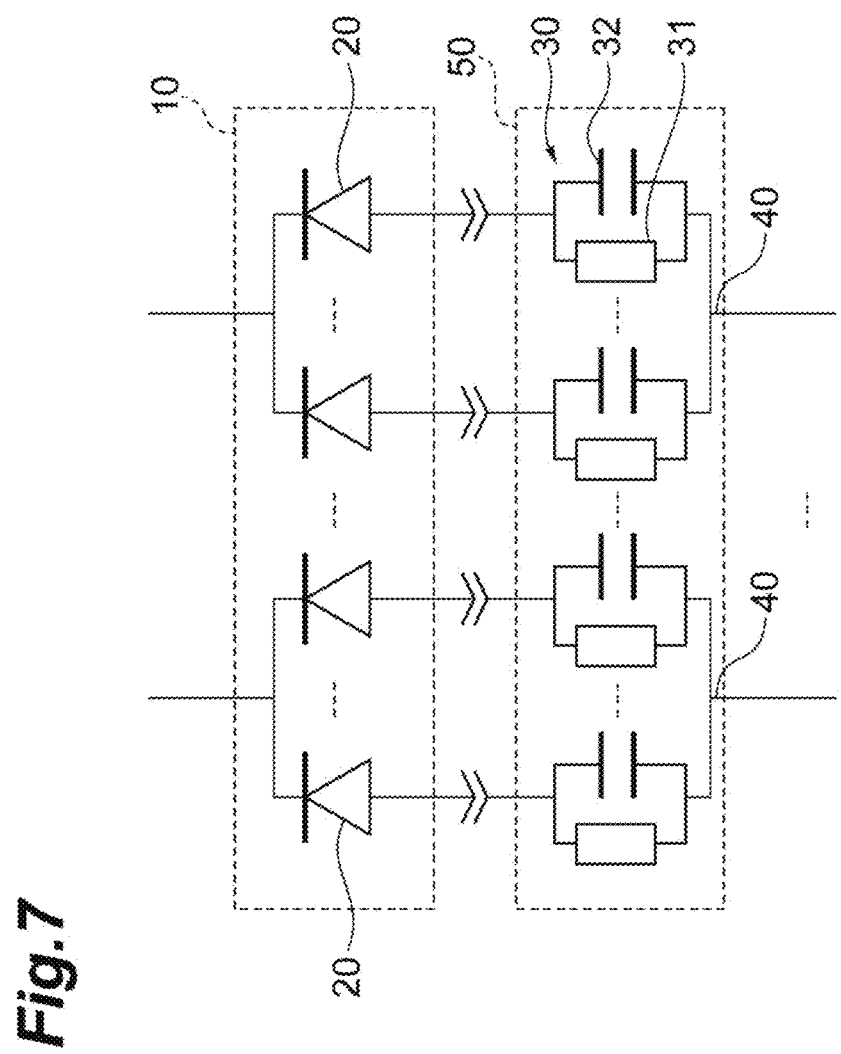
FIG. 7 is a view illustrating a circuit configuration capable of being used in a photodetector device according to a modification example of this embodiment.
Figure 8:
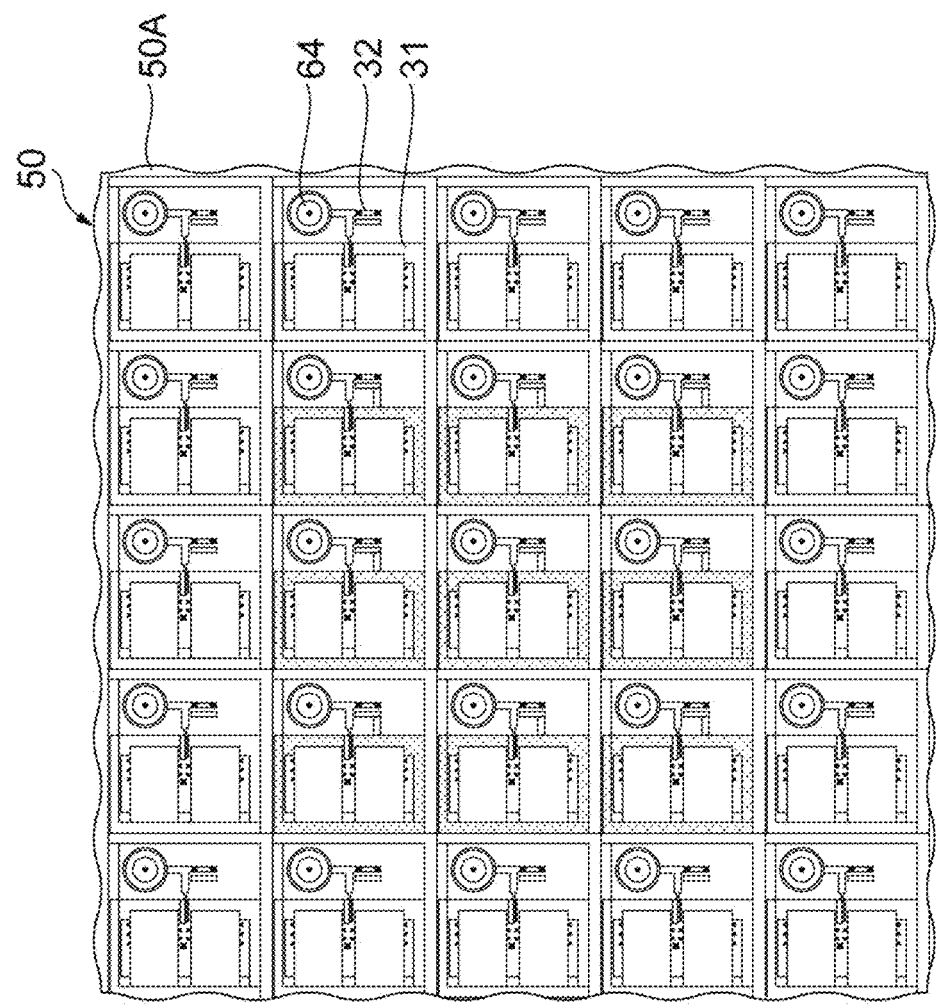
FIG. 8 is a plan view of a mounting region of the circuit substrate.

FIG. 7 is a view illustrating a circuit configuration capable of being used in a photodetector device according to a modification example of this embodiment. As illustrated in FIG. 7, a plurality of channels 40 may be formed in the circuit substrate 50. In this case, each of the channels 40 is formed by a plurality of output units 30 connected to each other in parallel. At least one of the plurality of channels 40 may be formed by the plurality of output units 30 connected to each other in parallel.

The circuit substrate 50 includes a silicon substrate 51, and a wiring layer 61 stacked on the silicon substrate 51. As illustrated in FIG. 2, the silicon substrate 51 includes a $P^+$ layer 52, a $P^-$ layer 53, and a $P^+$ layer 54 in this order from the main surface 50B side to the main surface 50A side. The $P^+$ layer 52 is provided by doping the $P^-$ layer 53 with impurities. The $P^+$ layer 54 is provided by doping the $P^-$ layer 53 with impurities. Examples of the doping impurities in the $P^-$ layer 53 include boron. For example, an oxide film layer 60 formed in an element isolation process by thermal oxidation is provided between the silicon substrate 51 and the wiring layer 61. The $P^+$ layer 54 is exposed from the oxide film layer 60, and is in contact with the wiring layer 61.

The wiring layer 61 includes an insulating layer 62, a ground electrode 63, an electrode pad 64, metal layers 65 and 66, vias 67, 68, 69, and 70, polysilicon layers 71, 72, and 73, and a dielectric layer 74. The ground electrode 63, the electrode pad 64, the metal layers 65 and 66, the vias 67, 68, 69, and 70, the polysilicon layers 71, 72, and 73, and the dielectric layer 74 are provided for every APD 20. The ground electrode 63, the electrode pad 64, and the metal layers 65 and 66 are formed in the same layer. In other words, the ground electrode 63, the electrode pad 64, and the metal layers 65 and 66 are formed at the same height in the thickness direction of the circuit substrate 50.

For example, the insulating layer 62 is formed from $SiO_2$. For example, the ground electrode 63, the electrode pad 64, and the metal layers 65 and 66 are formed from Al, AlCu, AlSiCu, or the like. The ground electrode 63, the electrode pad 64, and the metal layers 65 and 66 may be formed from the same material. For example, the vias 67, 68, 69, and 70 is formed from tungsten (W). For example, the dielectric layer 74 is formed from $SiO_2$ or $Si_3N_4$.

The wiring layer 61 is covered with the insulating layer 62. The $P^+$ layer 54 of the silicon substrate 51 is connected to the via 67 exposed from the insulating layer 62 of the wiring layer 61 to the silicon substrate 51 side. The $P^+$ layer 54 is connected to the ground electrode 63 through the via 67. The ground electrode 63 is disposed with respect to the electrode pad 64 and the metal layers 65 and 66 through the insulating layer 62 at an arrangement height of the ground electrode 63 in the thickness direction of the circuit substrate 50. The ground electrode 63 is not directly connected to the electrode pad 64 and the metal layers 65 and 66.

The electrode pad 64 is exposed from the insulating layer 62 and is connected to the APD 20 through the bump electrode 25. As illustrated in FIG. 8, a plurality of the electrode pads 64 are two-dimensionally arranged on the main surface 50A side. Each of the electrode pads 64 is connected to the polysilicon layer 71 through the via 68. The polysilicon layer 71 is connected to the metal layer 65 through the via 69. The electrode pad 64 is disposed with respect to the metal layers 65 and 66 through the insulating layer 62 at an arrangement height of the electrode pad 64 in the thickness direction of the circuit substrate 50. The electrode pad 64 is not directly connected to the metal layers 65 and 66. The polysilicon layer 71 is included in a first polysilicon layer.

The polysilicon layer 71 constitutes the passive quenching element 31. According to the above-described configuration, the passive quenching element 31 is connected in series to the APD 20 through the bump electrode 25, the electrode pad 64, and the via 68. That is, a pulse signal transmitted from the APD 20 is input to the passive quenching element 31 through the bump electrode 25, the electrode pad 64, and the via 68. The pulse signal input to the passive quenching element 31 is output from the channel 40 through the passive quenching element 31, the via 69 and the metal layer 65.

The electrode pad 64 is connected to the metal layer 66 at the arrangement height of the electrode pad 64 in the thickness direction of the circuit substrate 50. The metal layer 66 is connected to the polysilicon layer 72 through the via 70. The polysilicon layer 72 is stacked on the dielectric layer 74. The dielectric layer 74 is stacked on the polysilicon layer 73. The polysilicon layer 73 is connected to the metal layer 65 through a via (not illustrated). The polysilicon layer 71 and the polysilicon layer 73 are formed at the same height in the thickness direction of the circuit substrate 50. The polysilicon layer 71 and the polysilicon layer 72 may be formed at the same height in the thickness direction of the circuit substrate 50. The polysilicon layer 72 is included in a third polysilicon layer. The polysilicon layer 73 is included in a second polysilicon layer.

The polysilicon layer 72, the dielectric layer 74, and the polysilicon layer 73 constitute the capacitative element 32. According to the above-described configuration, the capacitative element 32 is connected in series to the APD 20 through the bump electrode 25, the electrode pad 64, and the via 68. That is, a pulse signal transmitted from the APD 20 is input to the polysilicon layer 72 of the capacitative element 32 through the bump electrode 25, the electrode pad 64 and the via 68. A pulse signal is output from the polysilicon layer 73 of the capacitative element 32 in correspondence with input of the pulse signal to the polysilicon layer 72 of the capacitative element 32. The pulse signal output from the capacitative element 32 is output from the channel 40 through a via (not illustrated) and the metal layer 65.

Both the passive quenching element 31 and the capacitative element 32 are electrically connected to the electrode pad 64 and the metal layer 65. Accordingly, the passive quenching element 31 and the capacitative element 32 are connected to each other in parallel.

Figure 9:
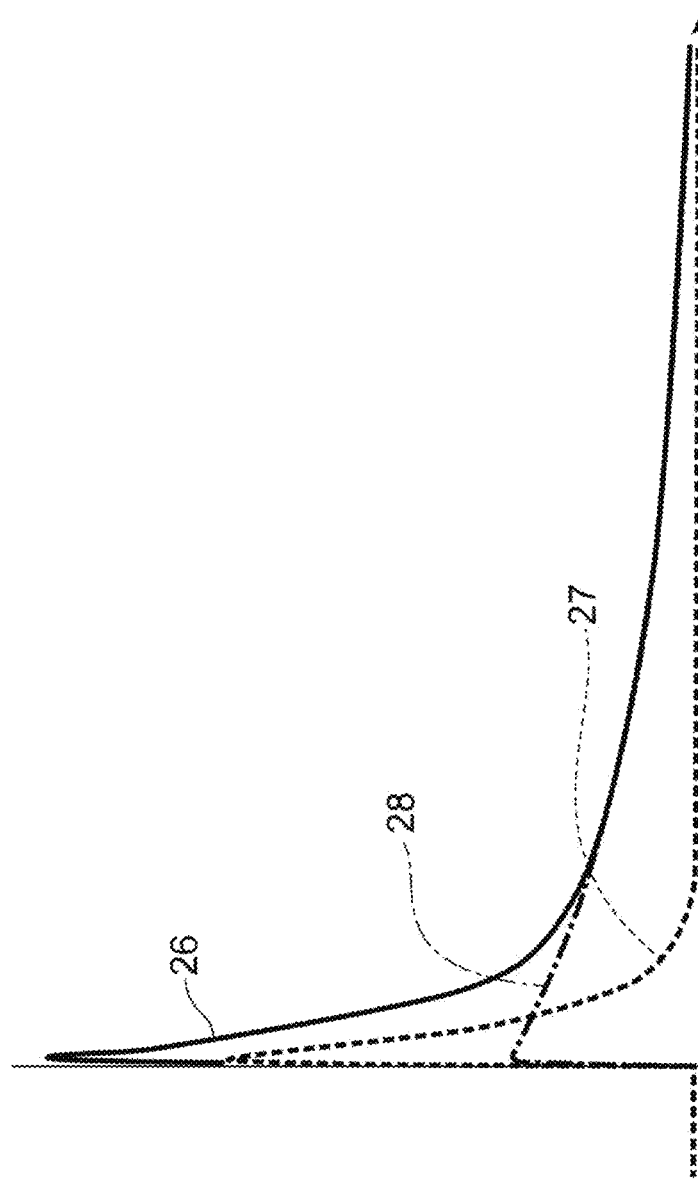
FIG. 9 is a view illustrating components of a pulse signal transmitted from an avalanche photodiode.

Next, an operational effect of the photodetector device 1 will be described with reference to FIG. 9 to FIG. 11. FIG. 9 illustrates a pulse signal output from the APD 20. As illustrated in FIG. 9, a pulse signal 26 from the APD 20 is classified into a fast pulse 27 and a recharge pulse 28. The fast pulse 27 is a pulse component having a peak value of the pulse signal. The recharge pulse 28 is a component that is detected after detection of the fast pulse 27 and has a pulse width longer than that of the fast pulse 27.

Figure 10:
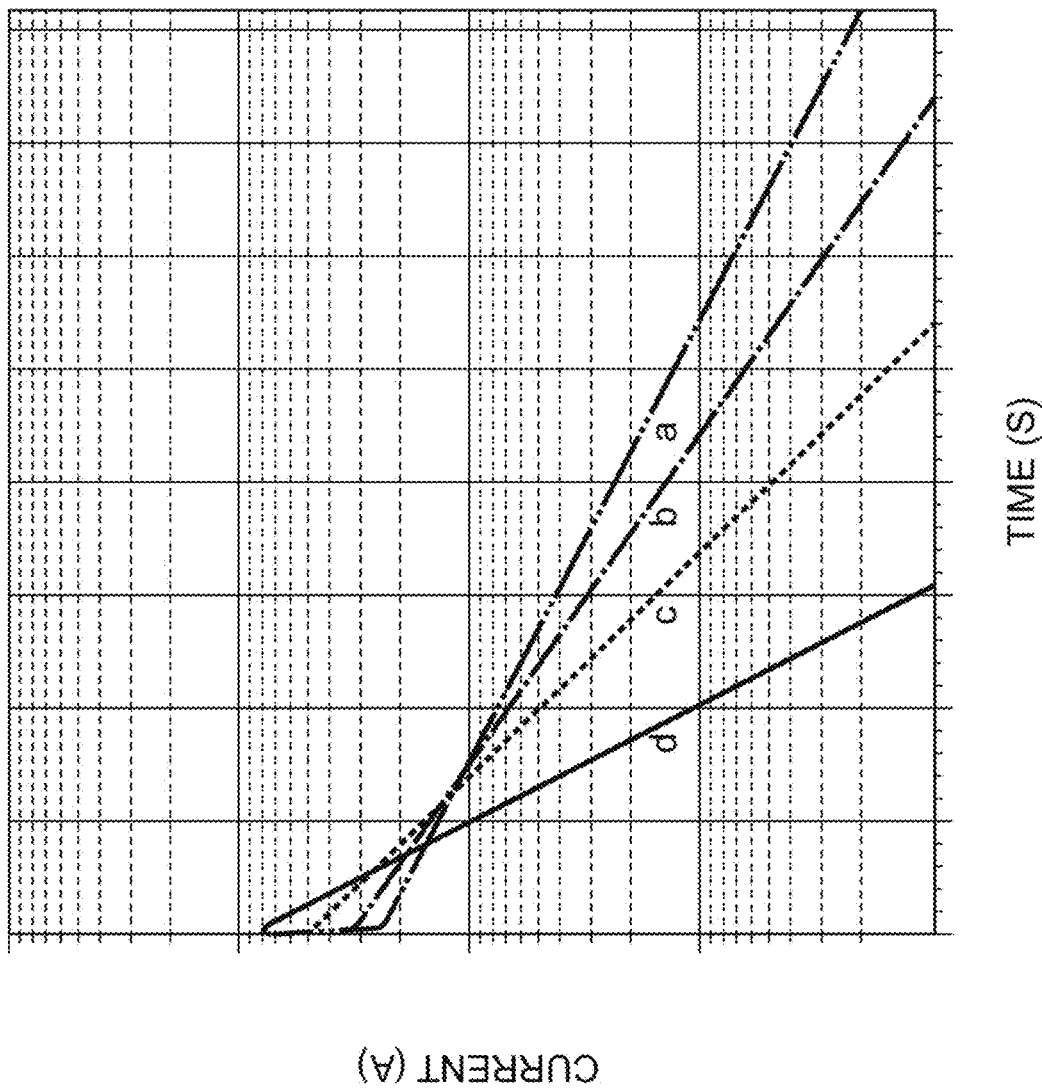
FIG. 10 is a view illustrating characteristics of a recharge pulse.

FIG. 10 illustrates a waveform of a pulse signal output from the APD 20 in a state in which the capacitative element 32 is excluded from the output unit 30 and a resistance value of the passive quenching element 31 is set as a parameter. FIG. 10 is an integer graph in which a unit of the vertical axis is set as a current (A) and a unit of the horizontal axis is set as time (s). Each of a plurality of pieces of data a, b, c, and d is data of the pulse signal in a case where a passive quenching element 31 having a different resistance value is provided in the output unit 30. In the order of the plurality of pieces of data a, b, c, and d, the passive quenching element 31 having a higher resistance value is provided.

As illustrated in FIG. 10, the smaller the resistance value of the passive quenching element 31 is, the steeper the inclination of the recharge pulse 28 is. The steeper the inclination of the recharge pulse 28, the shorter time necessary for quenching is, and the shorter dead time for which light is not detected by the APD 20 is. When using the passive quenching element 31 with a great resistance value, it is possible to realize appropriate quenching in which occurrence of a latching current or the like is suppressed. However, the greater the resistance value is, the further the dead time increases.

A pulse width of the pulse signal from the APD 20 connected to the passive quenching element 31 varies in response to the resistance value of the passive quenching element 31. As illustrated in FIG. 10, the greater the resistance value of the passive quenching element 31 is, the further the dead time of the APD 20 connected in series to the passive quenching element 31 increases. Accordingly, there is a demand for a circuit design including the passive quenching element 31 having an optimal resistance value to make appropriate quenching and a reduction of the dead time compatible with each other and to secure photodetection sensitivity and photodetection time resolution.

In the photodetector device 1, a plurality of the output units 30 including the passive quenching element 31 and the capacitative element 32 are provided in the circuit substrate 50 separate from the APD array substrate 10. According to this, a space capable of forming the plurality of output units 30 can be further expanded in comparison to a case where the plurality of output units 30 are arranged in the APD array substrate 10. Accordingly, the design of the plurality of output units 30 becomes easy.

Since the plurality of output units 30 are provided in the circuit substrate 50 separate from the APD array substrate 10, a parasitic capacitance that occurs between the configuration of the APD 20 and the output units 30 can be reduced. A manufacturing process different from that of the APD array substrate 10 can also be used. Since manufacturing processes which are respectively appropriate for the APD array substrate 10 and the circuit substrate 50 can be used, design of the plurality of output units 30 becomes easy.

Figure 11:
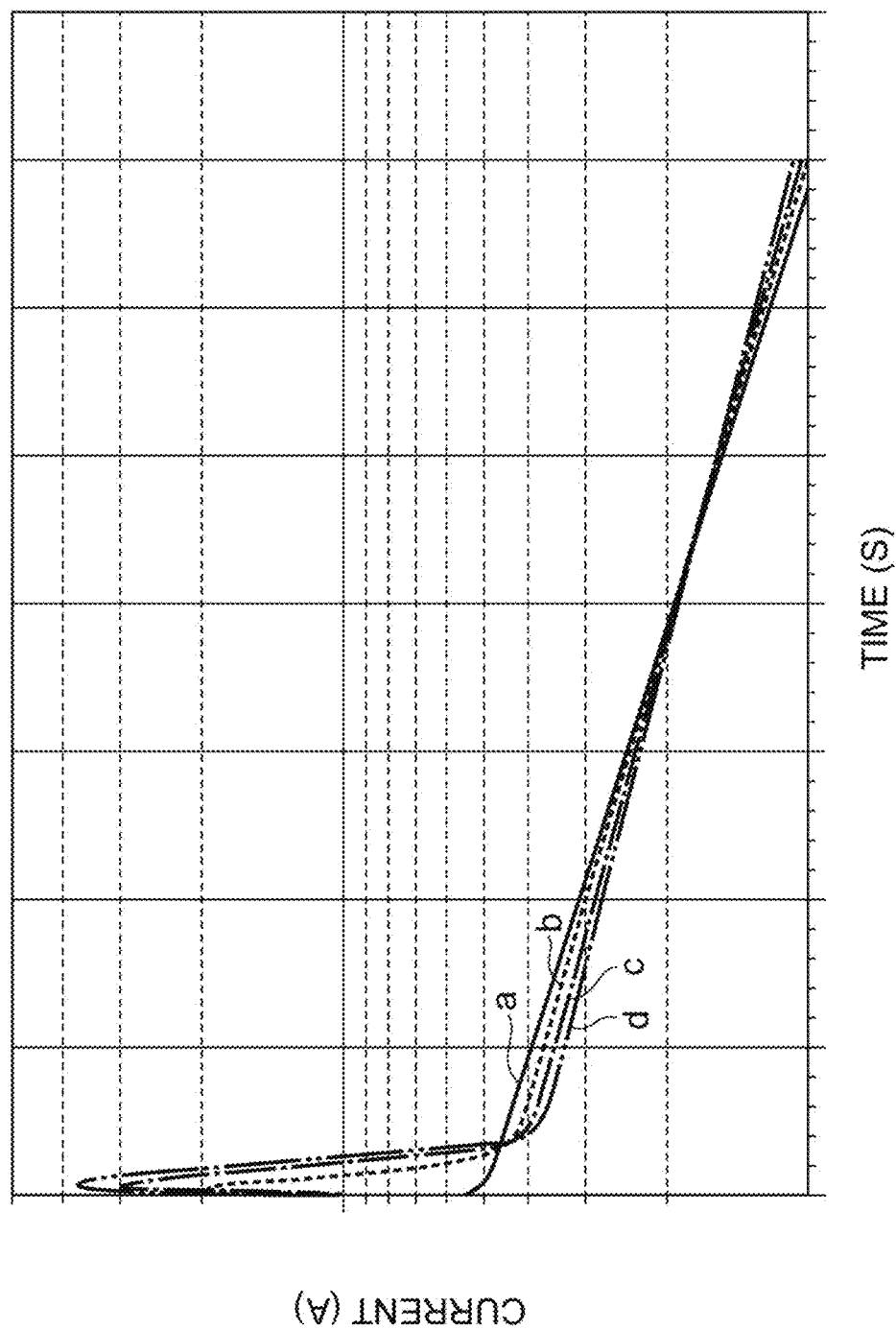
FIG. 11 is a view illustrating characteristics of a fast pulse.

FIG. 11 illustrates a waveform of a pulse signal output from the APD 20 in a state in which the passive quenching element 31 is set to a constant value, and an electrostatic capacitance of the capacitative element 32 is set as a parameter. FIG. 11 is a univariate graph in which a unit of the vertical axis is current (A) and a unit of the horizontal axis is time (s). Data a is data of a pulse signal in a case where the capacitative element 32 is excluded from the output unit 30. Each of a plurality of pieces of data b, c, and d is data of a pulse signal in a case where a capacitative element 32 having a different electrostatic capacitance is provided in the output unit 30. In the order of the plurality of pieces of data b, c, and d, the capacitative element 32 having a higher electrostatic capacitance is provided.

As illustrated in FIG. 11, when the capacitative element 32 is provided, a peak value of the fast pulse 27 is improved. The higher the electrostatic capacitance of the capacitative element 32 is, the greater the peak value of the fast pulse 27 is. Accordingly, when providing the capacitative element 32, time resolution of a pulse signal from the plurality of APDs 20 is improved. The greater the peak value of the fast pulse 27 is, the more easily the pulse signal from the plurality of APD 20 is detected.

In the photodetector device 1, the capacitative element 32 that is connected in series to at least one of the APDs 20, and is connected in parallel to the passive quenching element 31. According to the configuration, the peak value of the pulse signal from the APD 20 that is connected in series to the capacitative element 32 can be improved based on the electrostatic capacitance of the capacitative element 32 due to the characteristics described with reference to FIG. 11.

Accordingly, the pulse signal from the plurality of APDs 20 is easily detected, and the photodetection time resolution can be improved. The photodetector device 1 can count the number of incident photons while realizing desired photodetection sensitivity and photodetection time resolution.

In a configuration in which the plurality of APDs 20 operate in the Geiger mode in the APD array substrate 10 formed from the compound semiconductor, electric field strength applied to the APDs 20 is reduced, and thus an influence of a noise can be suppressed.

The photodetector device 1 includes the polysilicon layers 71 and 73 provided on the circuit substrate 50, the dielectric layer 74 provided on the polysilicon layer 73, and the polysilicon layer 72 provided on the dielectric layer 74. The passive quenching element 31 is formed by the polysilicon layer 71, and the capacitative element 32 is formed by the polysilicon layer 73, the dielectric layer 74, and the polysilicon layer 72. The polysilicon layer 71 is formed at the same height as in the polysilicon layer 72 or the polysilicon layer 73 in the thickness direction of the circuit substrate 50. In this case, the plurality of output units 30 can be formed in a simple manufacturing process.

Hereinbefore, description has been given of the embodiment of the invention, but the invention is not limited to the above-described embodiment, and various modifications can be made in a range not departing from the gist.

For example, the passive quenching element 31 may be formed by a metal thin film instead of the polysilicon layer 71. The capacitative element 32 may be formed by two metal layers instead of the polysilicon layers 72 and 73. In this case, the capacitative element 32 has a configuration in which two parallel metal layers sandwich the dielectric layer 74.

REFERENCE SIGNS LIST

1: photodetector device, 10: APD array substrate, 20: APD, 30: output unit, 31: passive quenching element, 32: capacitative element, 40: channel, 50: circuit substrate, 71, 72, 73: polysilicon layer, 74: dielectric layer.

The invention claimed is:

1. A photodetector device comprising:
an avalanche photodiode array substrate in which a plurality of avalanche photodiodes arranged to operate in a Geiger mode are two-dimensionally arranged, the avalanche photodiode array substrate being formed from compound semiconductor; and
a circuit substrate on which the avalanche photodiode array substrate is mounted,
wherein the circuit substrate includes a plurality of output units connected to each other in parallel to form at least one channel,
each of the output units includes a passive quenching element connected in series to at least one of the plurality of avalanche photodiodes, and a capacitative element connected in series to at least one of the avalanche photodiodes and connected in parallel to the passive quenching element.

2. The photodetector device according to claim 1,
wherein the passive quenching element is formed by a first polysilicon layer provided in the circuit substrate,
the capacitative element is formed by a second polysilicon layer provided in the circuit substrate, a dielectric layer stacked on the second polysilicon layer, and a third polysilicon layer stacked on the dielectric layer, and
the first polysilicon layer is formed at the same height as in the second polysilicon layer or the third polysilicon layer in a thickness direction of the circuit substrate.

* * * * *